United States Patent
Zizzo

(10) Patent No.: US 10,356,894 B2
(45) Date of Patent: Jul. 16, 2019

(54) COMPOSITE STRUCTURE

(71) Applicant: ROLLS-ROYCE PLC, London (GB)

(72) Inventor: Claudio Zizzo, Derby (GB)

(73) Assignee: ROLLS-ROYCE plc, London (GB)

( * ) Notice: Subject to any disclaimer, the term of this patent is extended or adjusted under 35 U.S.C. 154(b) by 1382 days.

(21) Appl. No.: 14/245,410

(22) Filed: Apr. 4, 2014

(65) Prior Publication Data

US 2014/0326715 A1 Nov. 6, 2014

(30) Foreign Application Priority Data

May 3, 2013 (GB) .................................. 1308023.9

(51) Int. Cl.
*H05K 1/00* (2006.01)
*H05K 1/11* (2006.01)
(Continued)

(52) U.S. Cl.
CPC .......... *H05K 1/0271* (2013.01); *B64D 29/08* (2013.01); *C08K 3/04* (2013.01); *C08K 7/06* (2013.01); *F01D 17/02* (2013.01); *F01D 25/24* (2013.01); *F02C 7/00* (2013.01); *H01B 1/24* (2013.01); *H05B 3/0004* (2013.01); *H05B 3/023* (2013.01); *F05D 2300/10* (2013.01);
(Continued)

(58) Field of Classification Search
CPC .. B64D 29/08; C08K 3/04; C08K 7/06; F01D 17/02; F01D 25/24; H05K 1/0271; H05K 1/0296; H05K 1/00; H05K 1/11; F02C 7/00; H01B 1/24; H05B 3/0004; H05B 3/10; F05D 2300/6012; F05D 2300/224; F05D 2300/614; F05D 2300/10; F05D 2300/603; Y02T 50/672

USPC .... 219/553, 200–202, 213, 209; 439/34, 55, 439/77, 78, 85; 174/250
See application file for complete search history.

(56) References Cited

U.S. PATENT DOCUMENTS

| 3,022,412 A * | 2/1962 | Waters ................... B64D 15/12 |
| | | 219/549 |
| 9,538,643 B2 * | 1/2017 | Zizzo ................... H05K 1/0298 |
| 2013/0189868 A1 | 7/2013 | Fitt et al. |

FOREIGN PATENT DOCUMENTS

| EP | 2 279 852 A1 | 2/2011 |
| EP | 2 441 678 A2 | 4/2012 |

(Continued)

OTHER PUBLICATIONS

Partial European Search Report issued in European Patent Application No. EP 14 16 2570 dated Sep. 1, 2014.
(Continued)

*Primary Examiner* — Michael G Hoang
(74) *Attorney, Agent, or Firm* — Oliff PLC

(57) ABSTRACT

A composite structure is provided. The structure is formed of rigid composite material in which particulates or fibers reinforce a polymer matrix. The structure has first and second electrically conductive metallic meshes embedded therein, and respective electrodes electrically connected to the meshes. The first and second meshes are electrically isolated from each other in the composite material so that the meshes can be held at different electrical potentials to each other. In use, an electrical unit can be provided to electrically bridge the first and second meshes such that electrical signals can be transmitted between the electrodes and the electrical unit via the meshes.

15 Claims, 6 Drawing Sheets

(51) Int. Cl.
*H05B 3/10* (2006.01)
*C08K 3/04* (2006.01)
*C08K 7/06* (2006.01)
*H01B 1/24* (2006.01)
*H05K 1/02* (2006.01)
*F02C 7/00* (2006.01)
*H05B 3/00* (2006.01)
*H05B 3/02* (2006.01)
*F01D 25/24* (2006.01)
*F01D 17/02* (2006.01)
*B64D 29/08* (2006.01)

(52) U.S. Cl.
CPC .. *F05D 2300/224* (2013.01); *F05D 2300/603* (2013.01); *F05D 2300/6012* (2013.01); *F05D 2300/614* (2013.01); *H05K 1/0296* (2013.01); *Y02T 50/672* (2013.01)

(56) References Cited

FOREIGN PATENT DOCUMENTS

| | | |
|---|---|---|
| GB | 1 579 559 | 11/1980 |
| GB | 2498014 A | 7/2013 |
| WO | WO 2013/190267 A1 | 12/2013 |

OTHER PUBLICATIONS

Search Report issued in British Application No. 1308023.9 dated Dec. 12, 2013.

\* cited by examiner

COMPOSITE STRUCTURE

CROSS-REFERENCE TO RELATED APPLICATIONS

This application is based upon and claims the benefit of priority from British Patent Application Number 1308023.9 filed 3 May 2013, the entire contents of which are incorporated by reference.

BACKGROUND OF THE INVENTION

1. Field of the Disclosure

The present invention relates to a composite structure which can be used to transmit electrical signals.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 802, 804, each provided with a respective connector component 806, 808 for connection to circuitry, which may be for example accommodated within the airframe of an aircraft in which the engine is installed.

The harnesses 802, 804 are assembled from individual wires and cables which are held together over at least part of their lengths by suitable sleeving and/or braiding. Individual wires and cables, for example those indicated at 810, emerge from the sleeving or braiding to terminate at plug or socket connector components 812 for cooperation with complementary socket or plug connector components 814 on, or connected to, the respective electrical components.

Each conventional harness 802, 804 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

OBJECTS AND SUMMARY

It would be desirable to provide an alternative, and preferably simpler, way of transmitting electrical signals.

Accordingly, in a first aspect, the present invention provides a composite structure formed of rigid composite material in which particulates or fibres reinforce a polymer matrix, the structure having first and second electrically conductive metallic meshes embedded therein, and respective electrodes electrically connected to the meshes,
wherein the first and second meshes are electrically isolated from each other in the composite material so that the meshes can be held at different electrical potentials to each other. In use, an electrical unit can be provided to electrically bridge the first and second meshes such that electrical signals can be transmitted between the electrodes and the electrical unit via the meshes It is generally possible to embed meshes in composite materials, and indeed in some structures such meshes may already be present or be desirable, for example in order to provide protection against electrical interference and/or surges (e.g. caused by lightning strikes). Advantageously, the meshes can, however, be used to transmit electrical signals, thereby potentially avoiding a need for separate and more complex signal transmission arrangements. The structure can also readily allow the addition of new electrical units or modification of their position. In addition, the structure can be electrically robust, having no single point of potential failure (unlike e.g. a wire).

In a second aspect, the present invention provides a gas turbine engine, having the composite structure of the first aspect.

In a third aspect, the present invention provides the use of the composite structure according to the first aspect for transmitting electrical signals (e.g. power and/or communication signals) via the first and second meshes between the electrodes and one or more electrical units which electrically bridge the meshes. For example, a method of transmitting electrical signals can include: providing the composite structure according to the first aspect, the structure further including one or more electrical units which electrically bridge the first and second meshes, and transmitting electrical signals between the electrodes and the electrical unit via the meshes.

Further optional features of the invention will now be set out. These are applicable singly or in any combination with any aspect of the invention.

The meshes can be arranged in layers in the structure.

The electrical signals can be power and/or communication signals.

The composite structure may be formed of rigid composite material in which continuous fibres reinforce the polymer matrix. For example, the continuous fibres may be carbon fibres. The continuous fibres may be woven. The continuous fibres may be in layers (e.g. woven layers) in the composite material.

The polymer matrix may be BMI (bismaleimide), PEEK (polyetheretherketone), PTFE (polytetraflouroethylene), PAEK (polyaryletherketone), polyurethane, and/or polyamides (such as nylon).

The meshes may be electrically isolated from each other by insulating barriers formed in the composite material. The one or more insulating barriers may be one or more insulating layers. For example, such insulating layers may be formed by layers (e.g. woven layers) of further reinforcing continuous fibres, such as glass fibres.

The potential difference produced, in use, between the first and second portions can be in the range from 1 to 48 V.

The composite structure may further include a power source, such as a battery or generator, which supplies electrical power to the electrodes and can thereby power the electrical unit. However, another option is for the electrodes to belong to another electrical unit which can thereby transmit electrical signals to or receive electrical signals from the first electrical unit. More particularly, the composite structure may further include one or more electrical units, which electrically bridge the first and second meshes (e.g. each unit can have an electrode which connects to the first mesh and an electrode which connects to the second mesh). When the composite structure includes a plurality of such electrical units, they can thereby communicate with each other via the meshes of the composite material.

The structure may have three, four or more electrically isolated metallic meshes, each of which can be held at a different electrical potential to the other meshes. Electrical units can then be provided to electrically bridge different meshes (e.g. different pairs of meshes). In this way, different groups of electrical units can have different communication channels or power supplies.

An embedded mesh may be used in the composite structure to provide heating to the structure. This may be achieved by providing power to an embedded mesh, for example using a power source. Such heating may, for example, prevent ice from forming on the composite structure and/or hold the composite structure at a desired temperature for operation and/or prevent the composite structure dropping below a pre-determined temperature. A thermometer (of any suitable form, such as a thermocouple or thermistor, for example), may be provided. The thermometer may be used to provide an input to a control system arranged to control the power supplied to the embedded mesh, and thus the heat output of the mesh.

An embedded mesh used to provide heat to the composite structure may be any embedded mesh, such as described herein my way of example. The embedded mesh may, for example, also provided electromagnetic protection to the composite structure, for example to any electrical system (including, for example, electrical conductors, which may form part of an electrical harness) embedded in the composite structure. Thus, an embedded mesh arranged to provide (for example selectively provide) heat to the composite structure may also be an electromagnetic screen.

Indeed, according to an aspect there is provided a rigid structure comprising an electrically conductive metallic mesh embedded therein, and respective electrodes electrically connected to the mesh to allow the mesh to be connected to a power source in use, thereby providing heating to the composite structure (in use). The mesh may be used to selectively provide electrical heating to the composite structure, for example in conjunction with a thermometer. The composite structure may comprise the power source connected to the mesh, the power source arranged to provide electrical heating power (for example selective electrical heating power) to the mesh in use.

Any suitable material may be used for any of the embedded meshes described and/or claimed herein, such as any conductive material, for example a metal, such as copper.

The composite structure may be for use on a vehicle.

For example, the composite structure may be a rigid raft for a gas turbine engine, wherein the raft has an electrical system in which one or more flexible printed circuit boards are embedded in the composite material and/or the raft has a fluid system (for one or more fluid passages for carrying e.g. cooling gas or air, fuel, lubricant, or hydraulic liquid) embedded in the composite material. As discussed above, a conventional gas turbine engine has a substantial number of electrical components which are connected by wires and/or cables assembled together in a harness, which comprises a large number of components, including various individual wires and/or bundles of wires, supporting components (such as brackets or cables) and electrical and/or mechanical connectors. Disassembly of a conventional harnesses can be complicated and/or time consuming. Further, the electrical conductors in a conventional harness may be susceptible to mechanical damage. However, an electrical rigid raft can provide a number of advantages over a conventional harness. For example, during assembly and in use, such rafts may provide greater protection to their electrical conductors (i.e. the flexible printed circuit boards) than conventional harnesses. In addition, the use of such rafts may significantly reduce the build and maintenance times of an engine, and/or reduce the possibility of errors occurring during such procedures. The rafts can also provide weight and size advantages over conventional harnesses. Similar advantages can accrue when fluids are transferred using the embedded fluid system of the rigid raft. Conveniently, when the rigid raft has an electrical system, relatively high power electrical units can be electrically connected to the electrical system, while relatively low power electrical units can be electrically connected to the electrodes (i.e. by electrically bridging the first and second meshes so that electrical signals can be transmitted between the electrodes and the low power electrical units via the meshes). However, the meshes may be able to supply reasonably high power electrical units.

Such an electrical raft need not necessarily have additional wires and/or flexible PCBs embedded therein, however. Thus, an electrical raft may provide electrical signals solely through the embedded meshes. All of the advantages described herein in relation to electrical rafts apply to electrical rafts with embedded meshes, regardless of whether the raft also comprises embedded wires and/or flexible PCBs.

More generally, modern aircraft make increasing use of composite material for panels and surfaces. On an engine there are a number of sensors, actuators and electronic units that require electrical power. Such units may also need to communicate. For example sensors may need to send data signals to an electronic control unit (e.g. a FADEC electronic engine control or an engine health monitoring unit) and the unit may need to send control signals to actuators to control valves, electric motors etc. Some of these signals can conveniently be sent via the meshes of the composite material.

It will be appreciated that where a feature is described herein as being "embedded" in a composite/rigid material, that feature may be described as being fixed in position by the rigid material, for example relative to the rest of the structure. It will also be appreciated that the embedded feature may be said to be surrounded by the rigid material and/or buried in the rigid material and/or integral with (or integrated into) the rigid material.

Further optional features of the invention are set out below.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 1:
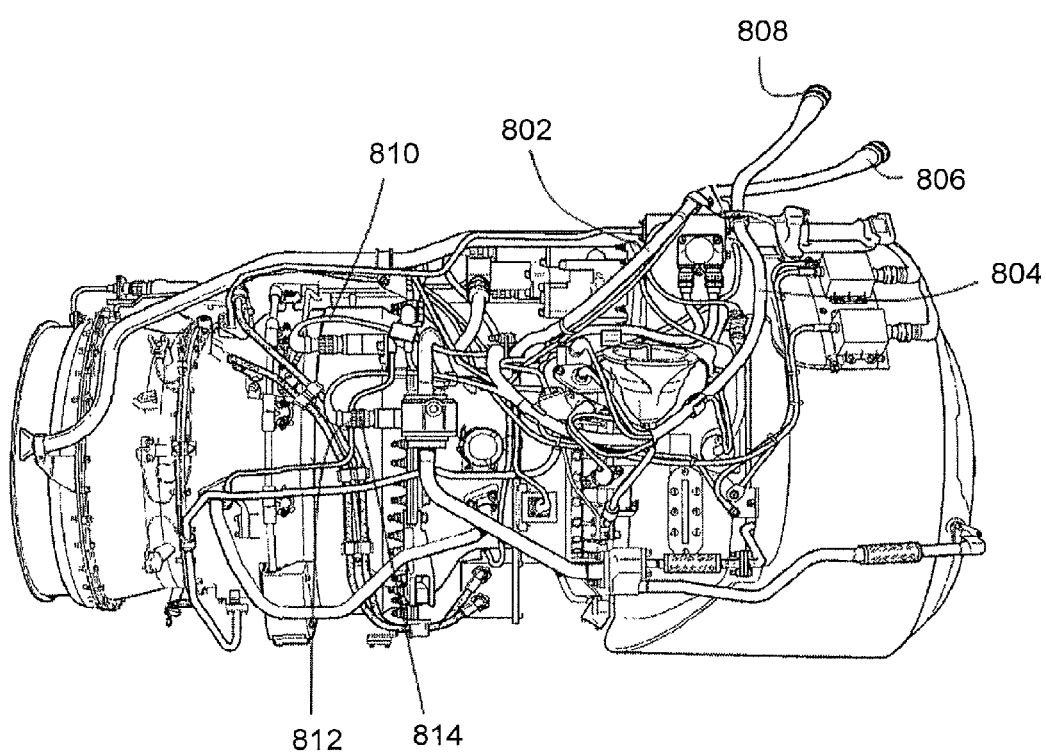
FIG. 1 shows a gas turbine engine with a conventional harness.
Figure 2:
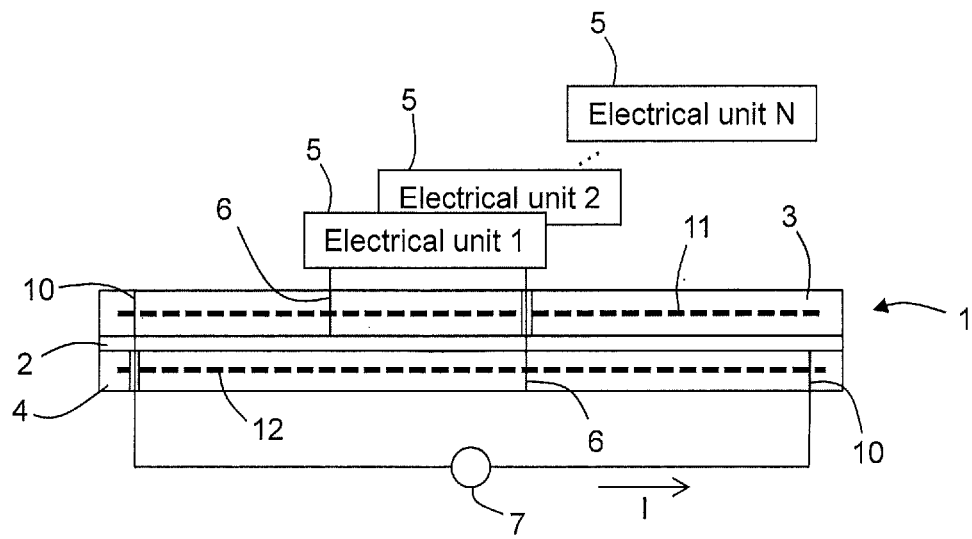
FIG. 2 shows schematically a side view of a panel formed of rigid composite material.

FIG. 2 shows schematically a side view of a panel 1 formed of rigid composite material. The panel may be part of a vehicle. The primary function of the panel may be mechanical (for example structural) and/or aerodynamic.

The composite material has a polymer matrix reinforced by particulates, such as chopped fibres, or continuous fibres, such as carbon fibres.

The panel contains upper 11 and lower 12 metallic meshes in the form of spaced layers. The spacing between the meshes helps to electrically isolate the meshes from each other so that the meshes can be held at different electrical potentials. However, particularly as some types of reinforcement, such as carbon fibres, can be electrically conductive, to better ensure this isolation, the panel is divided into an upper portion 3 and a lower portion 4 by a barrier layer 2. The barrier layer may contain insulating continuous reinforcing fibres, such as glass fibres. The upper portion contains the upper mesh 11 and the lower portion contains the lower mesh 12.

One or more electrical units 5 each have electrodes 6 by which the units electrically bridge the upper 11 and lower 12 meshes portion. Each unit 5 can thus receive electrical communication signals from or transmit such signals to other of the units 5 via the meshes.

However, the panel may have further electrodes 10 which connect to the meshes 11, 12. A power source 7, such as a generator or battery, can then supply electrical power to the units 5 via the further electrodes 10 and the meshes 11, 12. A current I, which can be AC or DC, thus flows to each unit around a circuit which includes the meshes.

Additionally or alternatively, the units 5 can receive electrical communication signals from or transmit such signals to the other electrical components (not shown) via the further electrodes 10.

The potential difference between the upper 11 and lower 12 meshes can be just a few volts (e.g. 1.8V to 10 V) for low power electrical units such as sensors, to 24 V to 28 V for higher power electrical units e.g. for driving actuators. Even higher potential differences are possible (e.g. around 115 V), but may have safety implications.

Advantageously, the units 5 can be located at arbitrary positions on the outer surface of the upper portion 3, providing e.g. flexibility to add extra units as required. Further, fault tolerance can be improved by a reduced likelihood of single point (e.g. broken wire) failure.

As described above, the meshes 11, 12 are used for electrical signal transmission. However, either or both of the meshes may have further functions, such as providing protection against electrical interference and/or surges.

Figure 3:
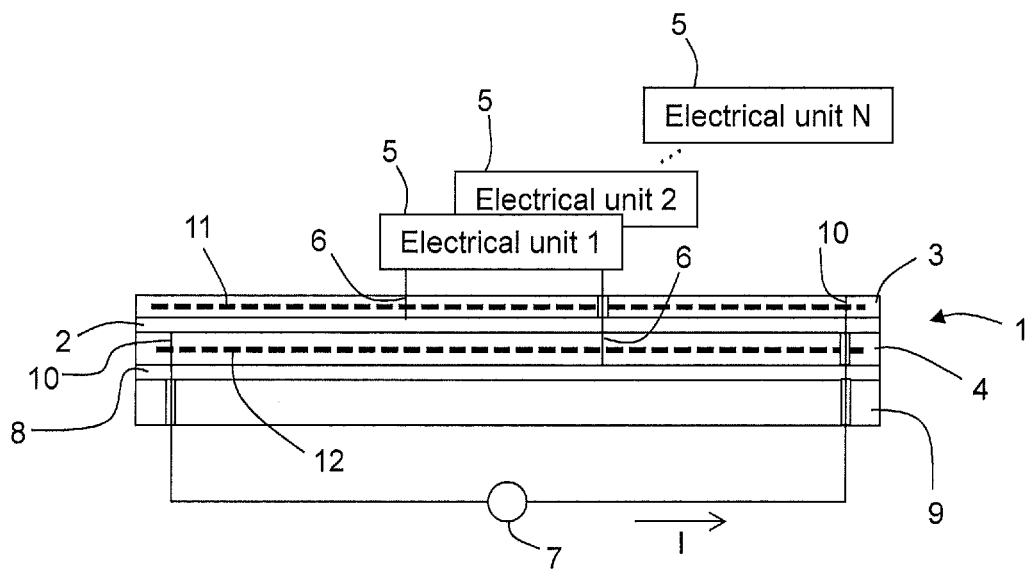
FIG. 3 shows schematically a side view of a further panel formed of rigid composite material.

FIG. 3 shows schematically a side view of a further panel 1 formed of rigid composite material. The panel is similar to the panel of FIG. 2, but is thicker and includes a second barrier layer 8 of insulating continuous reinforcing fibres, which is located beneath the lower portion 4 of the panel, and electrically isolates the lower portion from a base portion 9. As illustrated, the upper 11 and lower 12 meshes are held at different electrical potentials and are used to transmit electrical signals between the further electrodes 10 and the electrical units 5 and/or between the units themselves via the meshes. The base portion is isolated from the meshes and can be joined to other components. Current carried by the meshes can thus be prevented from short circuiting though those components.

However, although not shown in FIG. 3, other arrangements are possible. For example, the base portion 9 can contain a further metallic mesh and have a respective further electrode 10, and the three meshes can all be held at different potentials with electrical units bridging different meshes depending on the electrical and communication requirements of the individual units. Similarly, different power sources 7 can be used for different pairs of meshes.

Figure 8:
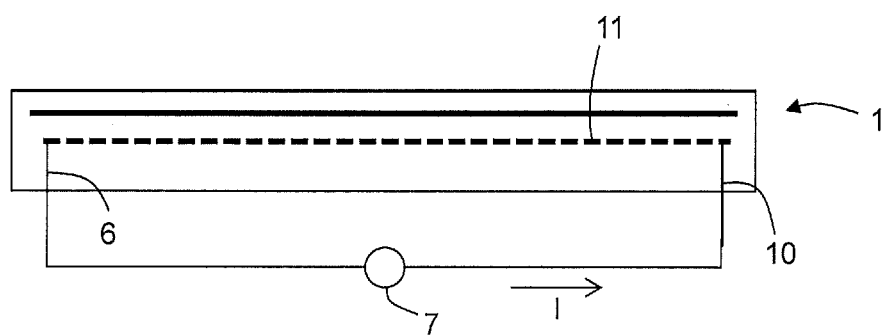
FIG. 8 shows a side view of another panel formed of a rigid composite material.

FIG. 8 shows schematically a side view of a further panel 1 formed of a rigid material, such as a rigid composite material. The panel of FIG. 8 is similar to that of FIGS. 2 and 3, but has a single mesh 11 connected to a power source 7 via electrodes 6, 10. The mesh 11 provides heating to the panel 1 in use. The mesh 11 may be an electromagnetic screen (or earthing) mesh, or a dedicated heating mesh.

In use, power may be selectively provided to the mesh 11 using the power source 7 in order to provide (selective) heating to the panel 1. Of course, one or more of the meshes shown in the arrangements of FIG. 2 or 3 may also be arranged to provide heating to their respective panels 1 through being provided with sufficient power from a power source 7.

As explained elsewhere herein, any one of the panels 1 described and/or claimed herein may have electrical conductors 252 embedded therein in addition to the mesh(es) 11, 12. For example, the FIG. 8 arrangement is shown as being provided with electrical conductors 252. Such electrical conductors may be, for example, in the form of a flexible PCB.

In FIGS. 2, 3 and 8, the panel 1 is shown as a flat structure. However, more complicated structures can be used. For example, a cylindrical composite structure (such as e.g. a gas turbine engine nacelle) can be used to transmit electrical signals.

Figure 4:
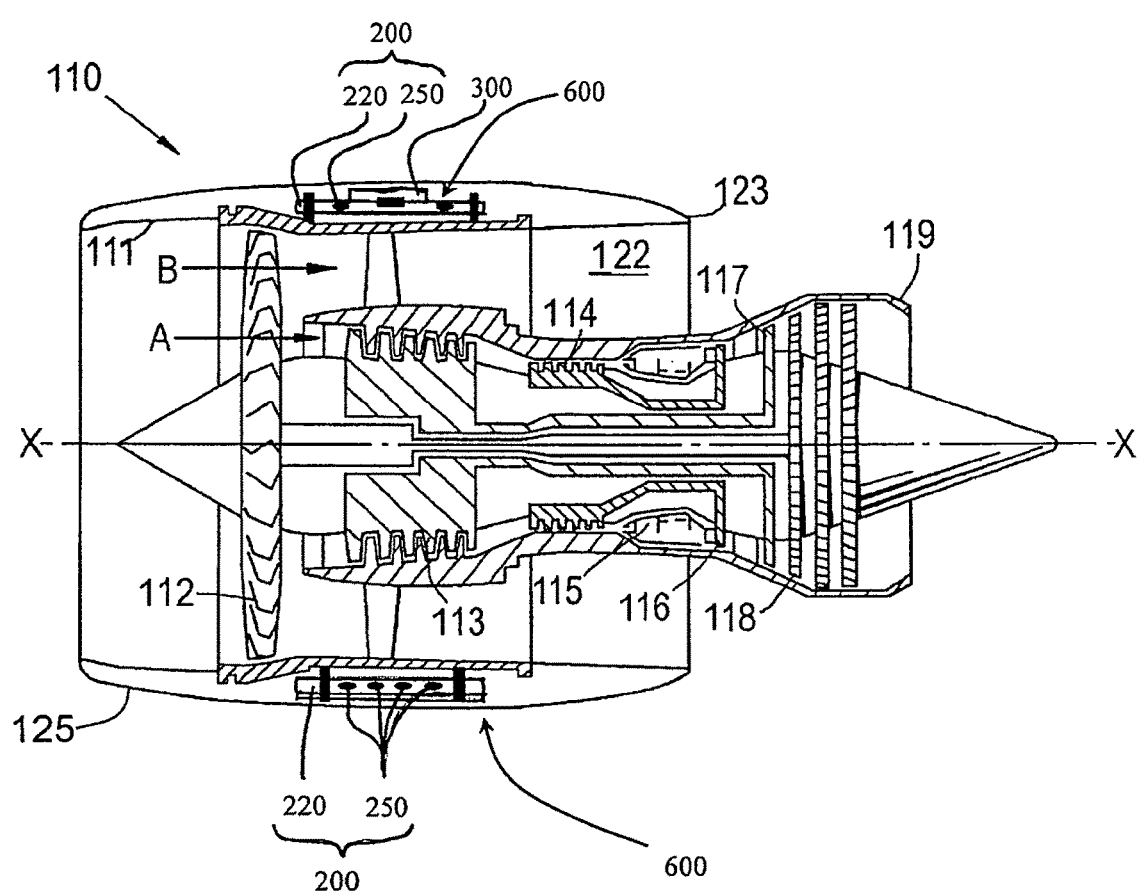
FIG. 4 shows a cross-section through a gas turbine engine in accordance with the present invention.

As indicated above, the composite structure can be a component of a gas turbine engine. With reference to FIG. 4, a ducted fan gas turbine engine generally indicated at 110 has a principal and rotational axis X-X. The engine 110 comprises, in axial flow series, an air intake 111, a propulsive fan 112, an intermediate pressure compressor 113, a high-pressure compressor 114, combustion equipment 115, a high-pressure turbine 116, and intermediate pressure turbine 117, a low-pressure turbine 118 and a core engine exhaust nozzle 119. The engine also has a bypass duct 122 and a bypass exhaust nozzle 123.

The gas turbine engine 110 works in a conventional manner so that air entering the intake 111 is accelerated by the fan 112 to produce two air flows: a first air flow A into the intermediate pressure compressor 113 and a second air flow B which passes through the bypass duct 122 to provide propulsive thrust. The intermediate pressure compressor 113 compresses the air flow A directed into it before delivering that air to the high pressure compressor 114 where further compression takes place.

The compressed air exhausted from the high-pressure compressor 114 is directed into the combustion equipment 115 where it is mixed with fuel and the mixture combusted. The resultant hot combustion products then expand through, and thereby drive the high, intermediate and low-pressure turbines 116, 117, 118 before being exhausted through the nozzle 119 to provide additional propulsive thrust. The high, intermediate and low-pressure turbines 116, 117, 118 respectively drive the high and intermediate pressure compressors 114, 113 and the fan 112 by suitable interconnecting shafts.

The composite structure can be, for example, the nacelle 125 which forms the outer aerodynamic surface of the engine.

However, the gas turbine engine 110 shown in FIG. 4 also has two electrical raft assemblies 600 which can be according to the invention. Each electrical raft assembly 600 comprises an electrical raft 200.

In FIG. 4, each electrical raft 200 (which may be referred to herein simply as a raft 200 or an electrical harness raft 200) comprises at least one flexible printed circuit board 250 (or FPC) embedded in a rigid composite material 220. The FPCs 250 may be used to transmit/transfer electrical signals (or electricity, including electrical power and/or electrical control signals) around the engine and/or to/from the engine 110 from other components, such as components of an airframe.

However, additionally or alternatively, the raft 200 may have a plurality of metallic meshes embedded therein to transmit electrical signals between electrical units 300 and electrodes which are electrically connected to the meshes, as described above in relation to FIGS. 2 and 3. Thus the raft 200 may comprise metallic meshes to transmit electrical signals and/or embedded wires (including FPCBs) to transmit electrical signals. As described elsewhere herein, for example in relation to FIG. 8, one or more embedded meshes may be arranged to provide electrical heating and/or electromagnetic screening to the raft 200.

In general, high power requirement units and/or units requiring many connections (such as an electronic engine control unit and an engine health monitoring unit) may communicate and receive power via the FPCs 250 of the raft 200, while low power requirement units and/or units requiring few connections (such as sensors and actuators) may communicate and receive power via the meshes of the raft. Indeed a unit may use both an FPC (e.g. for power supply) and the meshes (e.g. for transmission of control or data signals). However, this need not necessarily be the case, and the embedded meshes may be capable of supplying high power units, as well as low power units.

Figure 5:
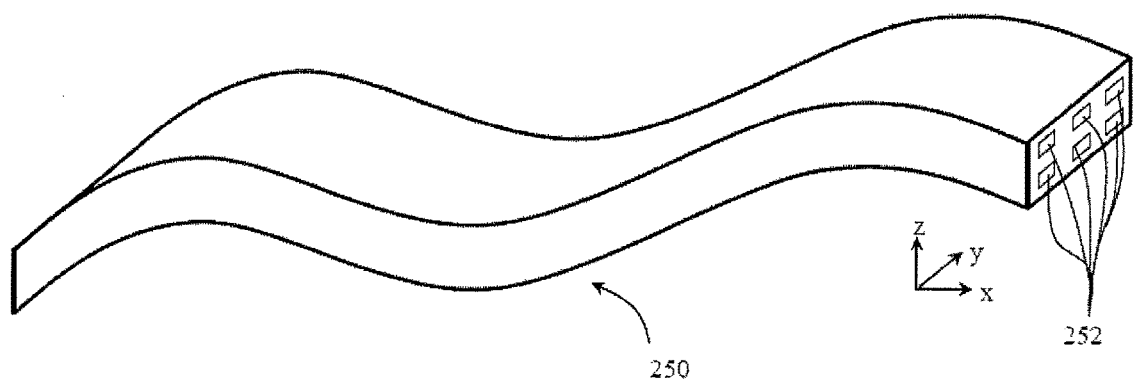
FIG. 5 shows a perspective view of a flexible printed circuit.
Figure 6:
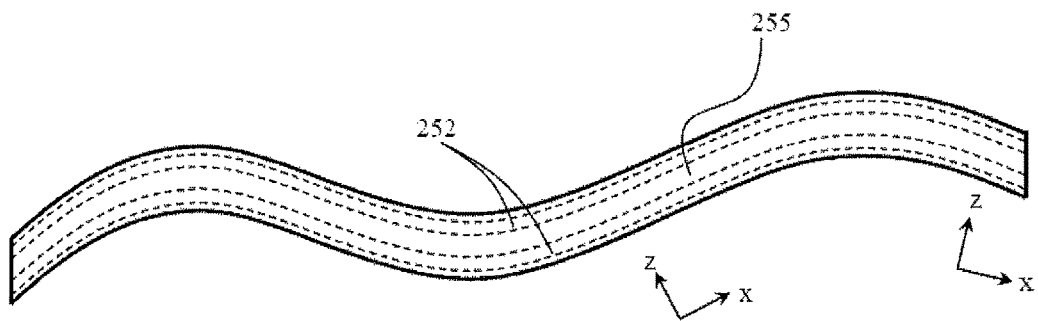
FIG. 6 shows a side view of the flexible printed circuit of FIG. 5.

An example of an FPC 250 is shown in greater detail in FIGS. 5 and 6. FIG. 5 shows a perspective view of the FPC 250, and FIG. 6 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 5 and 6, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 6. The x-y surface(s) (i.e. the surfaces formed by the x and y directions) may be said to be the major surface(s) of the FPC 250. In the example shown in FIGS. 5 and 6, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used. The conductive tracks 252, which may be surrounded by the substrate 255, may be used to conduct/transfer electrical signals (including electrical power and electrical control signals) through the rigid raft assembly (or assemblies) 200, for example around a gas turbine engine 110 and/or to/from components of a gas turbine engine and/or an airframe attached to a gas turbine engine.

An electrical raft 200 may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 7:
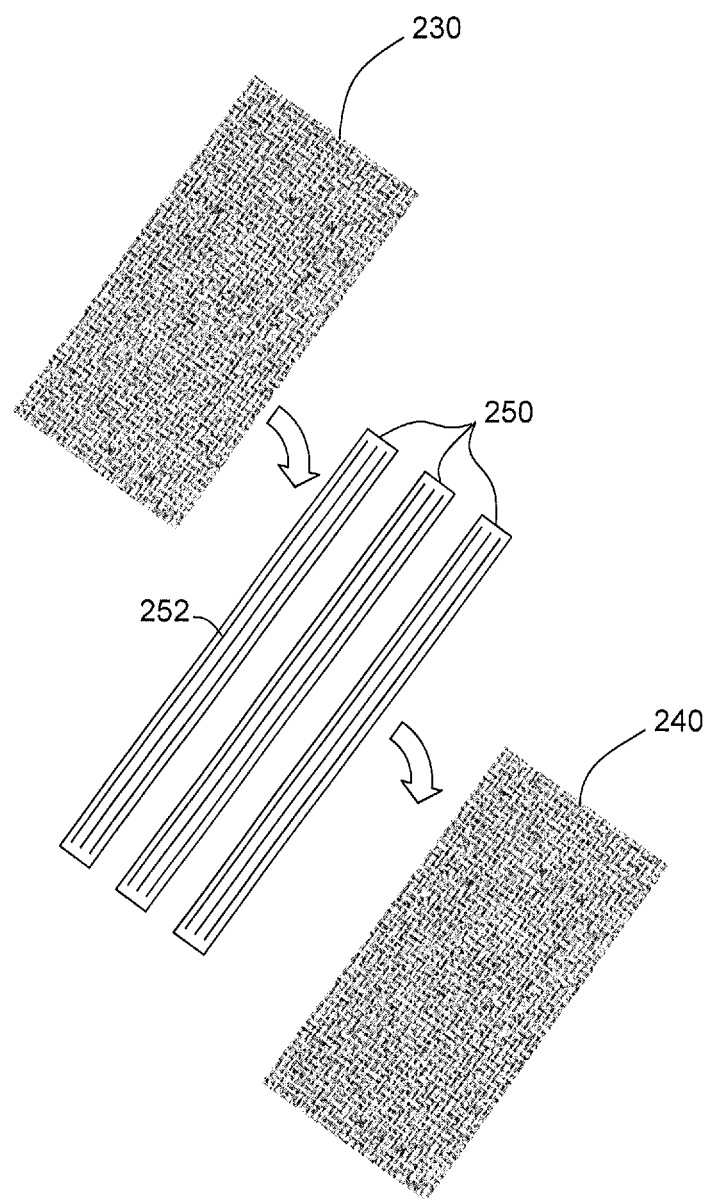
FIG. 7 shows a schematic of an electrical raft prior to assembly.

FIG. 7 shows components of an example of an electrical raft 200 prior to one method of construction. The FPCs 250 are provided between two layers of material 230, 240 that, after construction, form the rigid material 220. The material 230, 240 may be a fibre and resin compound. Such a fibre and resin compound may, after suitable treatment (for example heat treatment), produce the rigid composite material 220. In the example of FIG. 7, the fibre and resin compound is formed of a sheet of interwoven fibres, or strands. The strands in FIG. 7 extend in perpendicular directions, although the strands may extend in any one or more directions as required. The strands/fibres may be pre-impregnated (or "pre-pregged") with the resin.

Further layers of material 230, 240 are added to build up the raft 200, with metallic mesh layers 11, 12, such as those described above in relation to FIGS. 2 and 3, being sandwiched at suitable locations between the layers 230, 240. The electrodes 6, 10 may also be included as the layers are built up, and layers of insulating material can be included to improve the electrical isolation of the meshes.

Prior to any treatment, both the layers 230, 240, the FPCs 250 and the meshes 11, 12 may be flexible, for example supple, pliable or malleable. As such, when the layers, FPCs and/or meshes are placed together, they may be moulded, or formed, into any desired shape. For example, they may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions.

Any suitable method could be used to produce the electrical raft 200. For example, the strands/fibres need not be pre-impregnated with the resin. Instead, the fibres/strands could be put into position (for example relative to the FPCs 250 and meshes) in a dry state, and then the resin could be fed (or pumped) into the mould. Such a process may be referred to as a resin transfer method.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

I claim:

1. A composite structure formed of rigid composite material in which particulates or fibres reinforce a polymer matrix, the composite structure comprising:
    a first layer of the composite material;
    a second layer of the composite material;
    an insulating barrier formed in a third layer of the composite material and disposed between the first layer and the second layer, the first layer, the second layer and the third layer being different layers;
    a first electrically conductive metallic mesh embedded in the first layer;
    a second electrically conductive metallic mesh embedded in the second layer; and
    respective electrodes electrically connected to the first and second meshes,
    wherein the first and second meshes are electrically isolated from each other by the insulating barrier, and the first mesh has an electrical potential that is different from the electrical potential of the second mesh; and
    an electrical unit that is electrically connected between the first and second meshes,
    wherein electrical signals are transmitted between the electrodes and the electrical unit via the first and second meshes.

2. The composite structure according to claim 1, wherein the electrical signals are power and/or communication signals.

3. The composite structure according to claim 1, wherein continuous fibres reinforce the polymer matrix.

4. The composite structure according to claim 3, wherein the continuous fibres are carbon fibres.

5. The composite structure according to claim 1, wherein the first and second meshes are further electrically isolated from each other by another insulating barrier formed in the composite material.

6. The composite structure according to claim 1, further including a power source which supplies electrical power to the electrodes and can thereby power the electrical unit.

7. The composite structure according to claim 1, the electrical unit including a plurality of electrical units which are electrically connected between the first and second meshes.

8. The composite structure according to claim 7, wherein
    each of the plurality of electrical units has an electrode in electrical contact with the first mesh and an electrode in electrical contact with the second mesh, and
    electrical signals are transmitted between the each of the plurality of electrical units via the first and second meshes.

9. The composite structure according to claim 1, further comprising:
    a power source connected to at least one of the first mesh and the second mesh, such that the at least one of the first mesh and the second mesh to which the power source is connected provides electrical heating to the composite structure.

10. The composite structure according to claim 1, wherein the composite structure is used on a vehicle.

11. The composite structure according to claim 1, which is a rigid raft for a gas turbine engine, wherein the raft has an electrical system in which flexible printed circuit boards are embedded in the composite material.

12. The composite structure according to claim 1, wherein at least one of the first and second meshes is an earthing mesh, which protects the structure against electrical interference and/or surges.

13. The composite structure according to claim 1, wherein the insulating barrier is made of an insulating material and each of the first layer and the second layer are made of a material that is different from the insulating material of the insulating barrier.

14. A gas turbine engine, comprising:
    the composite structure according to claim 1.

15. A method comprising:
    transmitting electrical signals with the composite structure according to claim 1, via the first and second meshes between the electrodes and at least one of the electrical unit, the at least one of the electrical unit being electrically connected between the first and second meshes.

* * * * *